United States Patent
Loo et al.

(10) Patent No.: US 7,829,411 B2
(45) Date of Patent: Nov. 9, 2010

(54) METHOD AND DEVICE TO FORM HIGH QUALITY OXIDE LAYERS OF DIFFERENT THICKNESS IN ONE PROCESSING STEP

(75) Inventors: Josine Johanna Gerarda Petra Loo, Leuven (BE); Youri Ponomarev, Leuven (BE); Robertus Theodorus Fransiscus Schaijk, Leuven (BE)

(73) Assignee: NXP B.V., Eindhoven (NL)

( * ) Notice: Subject to any disclaimer, the term of this patent is extended or adjusted under 35 U.S.C. 154(b) by 252 days.

(21) Appl. No.: 10/503,046

(22) PCT Filed: Jan. 20, 2003

(86) PCT No.: PCT/IB03/00136

§ 371 (c)(1),
(2), (4) Date: Jul. 29, 2004

(87) PCT Pub. No.: WO03/065437

PCT Pub. Date: Aug. 7, 2003

(65) Prior Publication Data

US 2005/0079732 A1    Apr. 14, 2005

(30) Foreign Application Priority Data

Feb. 1, 2002 (EP) .................................. 02075425

(51) Int. Cl.
*H01L 21/336* (2006.01)
(52) U.S. Cl. .................. 438/257; 438/265; 438/770; 257/E29.226; 257/E29.241
(58) Field of Classification Search ................ 438/257, 438/264–265, 765, 770, 593; 257/E29.226, 257/E29.241
See application file for complete search history.

(56) References Cited

U.S. PATENT DOCUMENTS

| | | | | |
|---|---|---|---|---|
| 4,210,993 A * | 7/1980 | Sunami | .................. | 438/297 |
| 5,273,914 A * | 12/1993 | Miyajima et al. | .......... | 438/231 |
| 5,918,116 A | 6/1999 | Chittipeddi | | |
| 5,940,692 A * | 8/1999 | Jeng et al. | .................. | 438/163 |
| 6,274,429 B1 * | 8/2001 | Misra | .................. | 438/257 |
| 6,344,386 B1 * | 2/2002 | Io | .................. | 438/238 |
| 6,380,035 B1 * | 4/2002 | Sung et al. | .................. | 438/264 |
| 6,489,200 B1 * | 12/2002 | Leu et al. | .................. | 438/257 |
| 6,541,321 B1 * | 4/2003 | Buller et al. | ................ | 438/197 |
| 6,624,023 B1 * | 9/2003 | Han et al. | .................. | 438/257 |
| 6,660,587 B2 * | 12/2003 | Ahn et al. | .................. | 438/257 |
| 2001/0018274 A1 * | 8/2001 | Sugizaki et al. | ............. | 438/773 |
| 2002/0127806 A1 | 9/2002 | Chen | | |
| 2003/0022488 A1 * | 1/2003 | Ahn et al. | .................. | 438/652 |
| 2003/0102504 A1 * | 6/2003 | Chern et al. | ................ | 257/321 |
| 2003/0205747 A1 * | 11/2003 | Chen | .................. | 257/296 |
| 2004/0014274 A1 * | 1/2004 | Wils et al. | .................. | 438/222 |

OTHER PUBLICATIONS

Patent Abstracts of Japan, vol. 006, No. 037 (E-097), Mar. 6, 1982.

* cited by examiner

*Primary Examiner*—Thanh Nguyen

(57) ABSTRACT

The present invention relates to a method for forming high quality oxide layers of different thickness over a first and a second semiconductor region in one processing step. The method comprises the steps of:

doping the first and the second semiconductor region with a different dopant concentration, and oxidising, during the same processing step, both the first and the second semiconductor region under a temperature between 500° C. and 700° C., preferably between 500° C. and 650° C.

A corresponding device is also provided.

Using a low-temperature oxidation in combination with high doping levels results in an unexpected oxidation rate increase.

12 Claims, 4 Drawing Sheets

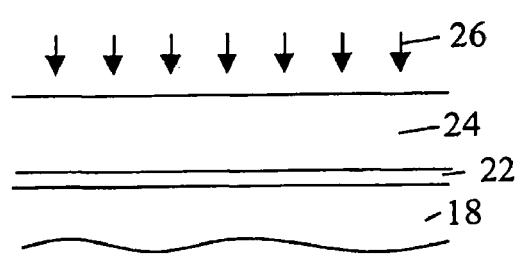
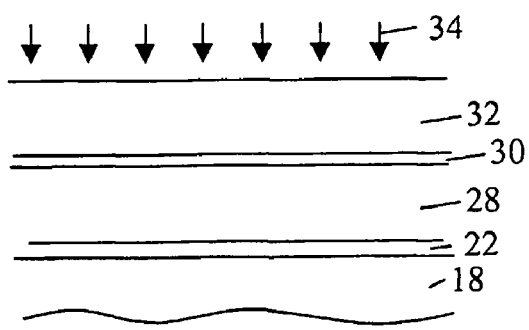
FIG.3A  FIG.3B
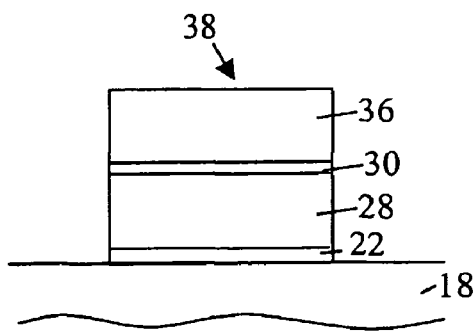
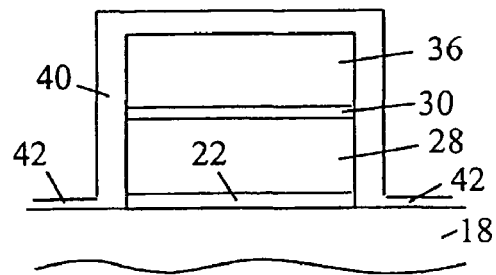
FIG.3C  FIG.3D

METHOD AND DEVICE TO FORM HIGH QUALITY OXIDE LAYERS OF DIFFERENT THICKNESS IN ONE PROCESSING STEP

The present invention relates to a method and device for forming high quality oxide layers of different thickness during one and the same processing step. This can be used for example for isolating a memory gate stack from an access gate in a non-volatile memory (NVM) cell such as a 2 transistor (2-T) flash memory cell.

Flash memories or flash memory cells comprise a MOSFET with a floating gate between a control gate and a channel region. With the improvement of fabrication technologies, the floating gate size has been reduced to nanometer scale. These devices are basically miniature EEPROM cells in which electrons (or holes) are injected in a nano floating gate by tunnel effect through an oxide barrier. Charges stored in the floating gate modify the device threshold voltage. A schematic representation of a 2 transistor (2-T) flash EEPROM cell 10 is depicted in FIG. 1. It comprises a storage transistor or memory gate stack 12, and a selecting transistor or access gate 14. A schematic cross-section through a compact 2-T flash EEPROM cell 10 is given in FIG. 2.

In such memory cells 10, the access gate 14 and the memory gate stack 12 are isolated from each other by an isolation spacer 16. In a typical 2-T flash memory cell, this isolation is a TEOS (Tetraethyl Orthosilicate—$Si(OC_2H_5)_4$) spacer.

TEOS is a liquid source oxide deposition with excellent uniformity, step coverage and film properties. Disadvantages in using TEOS include its high temperature and liquid source requirements. After applying the TEOS spacers, a plasma etch thereof is carried out. Generally, the TEOS spacers are over-etched, which means that the silicon substrate 18 at the location where the gate oxide 20 of the access gate 14 has to be grown, is damaged. This results in a degradation of the silicon interface where high quality gate oxide 20 has to be formed for the access gate or selecting transistor 14.

It is known from X. Tang et al., "Self-aligned silicon-on-insulator nano flash memory device", Solid State Electronics 44 (2000), p.2259-2264 that the silicon oxidation rate depends on the concentration of doping impurities such as e.g. arsenic (As). For short times, the relationship between the oxide thickness ($X_O$) and oxidation time (t) is given by:

$$\frac{X_o}{t} = A$$

where A is a linear oxidation rate constant determined by the intrinsic linear oxidation rate constant, and depending on the partial pressure, on free carrier concentration, on chlorine concentration and on doping level of the silicon. Increasing doping levels enhances the silicon oxidation rate, which means that, for oxidations carried out under a same temperature, silicon with a higher doping level of a certain dopant leads to a thicker oxide layer thereupon than silicon with a lower doping level of the same dopant.

U.S. Pat. No. 6,015,736 describes a system and method for providing a flash memory cell on a semiconductor. On the semiconductor substrate, a tunnel oxide is grown, on top of which a gate stack comprising a floating gate, an inter-layer and a control gate is provided using conventional methods. The gate stack is then oxidized at a differential rate from oxidation of the surface of the underlying semiconductor. The differential rate of oxidation allows the gate stack to oxidize much more quickly than a portion of the semiconductor that is adjacent to the gate stack. This is obtained, in a preferred embodiment, by providing an implant at a high angle to impact the side of the gate stack. The implant allows the gate stack, which otherwise would oxidize at approximately the same rate as the semiconductor, to oxidize at a higher rate. According to another embodiment, the surface of the side of a polysilicon gate is treated so as to be amorphous, because an oxide may grow more rapidly on an amorphous surface than on a crystalline surface.

The prior art methods described above result in a gate stack isolation layer that is about a factor 3 thicker than the oxidation layer provided on the undoped silicon substrate.

It is an object of the present invention to overcome the disadvantages of the prior art. More particularly, it is an object of the present invention to obtain high quality oxide layers of different thickness in one processing step.

It is a further object of the present invention to obtain, in one process step, high quality oxide layers of at least a first and a second thickness, the first thickness being at least a factor 10 higher than the second thickness.

Yet a further object of the present invention is to provide a method for isolating a memory gate stack from an access gate in a non-volatile memory cell. It is also an object of the present invention to provide a non-volatile memory cell of which the memory gate stack is isolated from the access gate.

The above objectives are accomplished by the methods and devices according to the present invention.

A method according to the present invention for forming high quality oxide layers of different thickness over a first and a second semiconductor region in one processing step comprises the steps of:
  doping the first and the second semiconductor regions with a different dopant concentration, and
  oxidising both the first and the second semiconductor region during the same processing step at a temperature between 500° C. and 700° C., preferably between 500° C. and 650° C.

According to an embodiment of the present invention, the dopant concentration of the first semiconductor region is at least a factor 10 higher than the dopant concentration of the second semiconductor region.

The doping step may be carried out with n-type dopants or with p-type dopants.

The method may furthermore comprise, before the doping step, a step of providing a first and a second semiconductor region. This step of providing the first semiconductor region may comprise providing a doped gate stack. The step of providing a doped gate stack may comprise the steps of:
  growing a tunnel oxide on the semiconductor,
  depositing floating gate polysilicon on the tunnel oxide,
  doping the floating gate polysilicon, thus forming doped floating gate polysilicon,
  depositing an interlayer dielectric on the doped floating gate polysilicon,
  depositing control gate polysilicon on the interlayer dielectric, and
  doping the control gate polysilicon.

A method according to the present invention wherein a doped gate stack is provided, may further comprise a step of patterning the doped gate stack.

According to an embodiment of the present invention, the oxidising step is a wet oxidation process.

The present invention also provides a non-volatile memory element having a memory gate stack isolated from an access gate obtained by any of the methods according to the present invention. The element may be a 2-T flash EEPROM cell.

These and other features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

FIGS. 3A to 3D show different steps in the fabrication of a 2-T flash EEPROM cell.

Figure 5A:
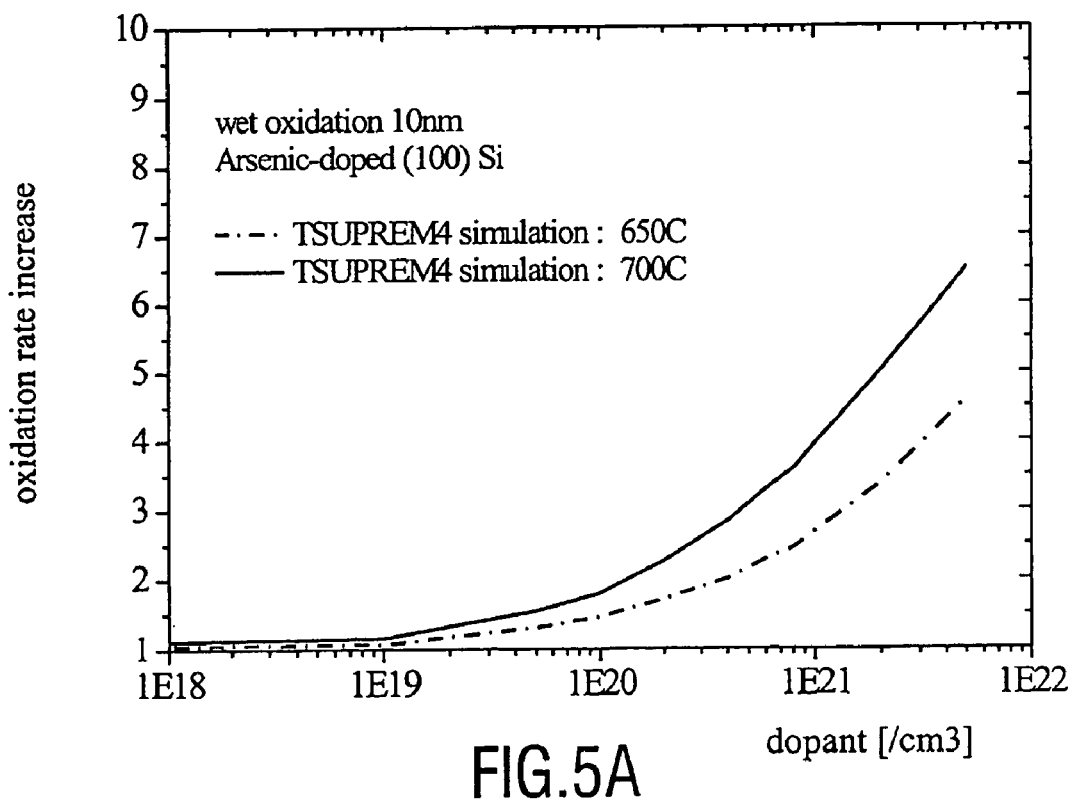
FIG. 5A shows the expected oxidation rate increase for As-doped Si in function of dopant concentration, for a 10 nm thick oxide obtained by wet oxidation at 650° C. and 700° C.
Figure 5B:
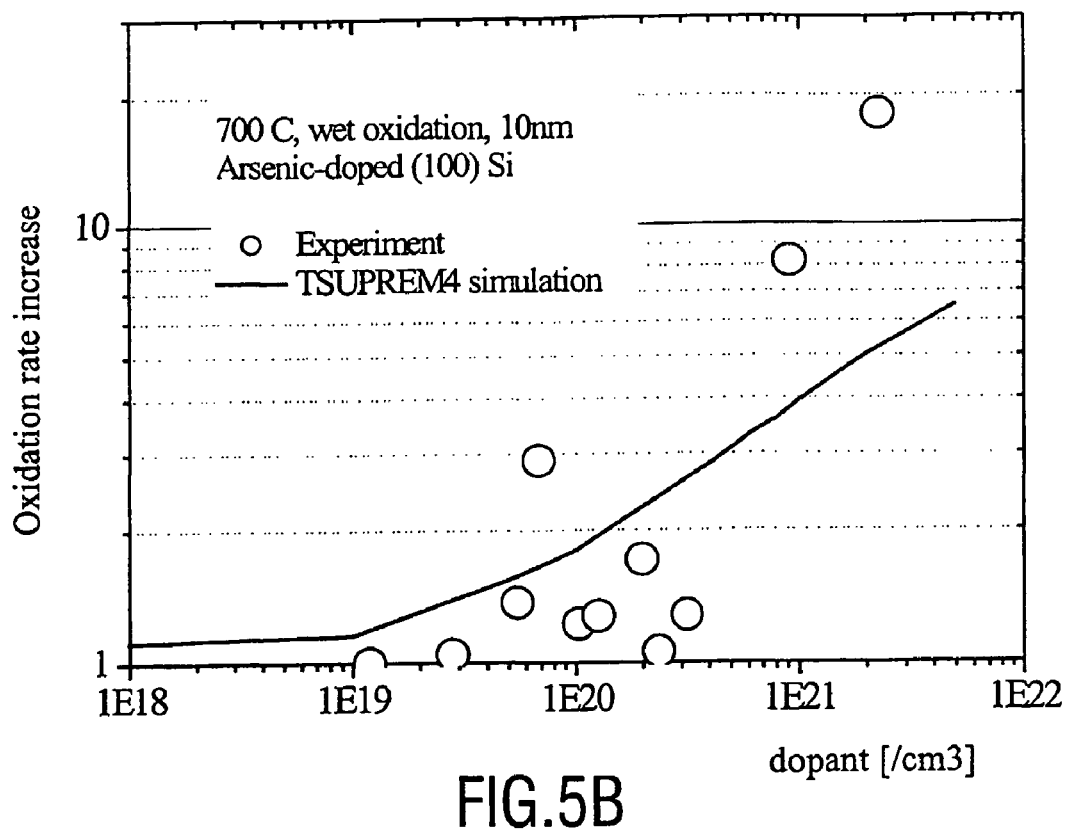
FIG. 5B shows the oxidation rate increase for As-doped Si in function of dopant concentration, for a 10 nm thick oxide obtained by wet oxidation at 700° C. Expected oxidation rate increase is compared to experimentally obtained oxidation rate increase.
Figure 5C:
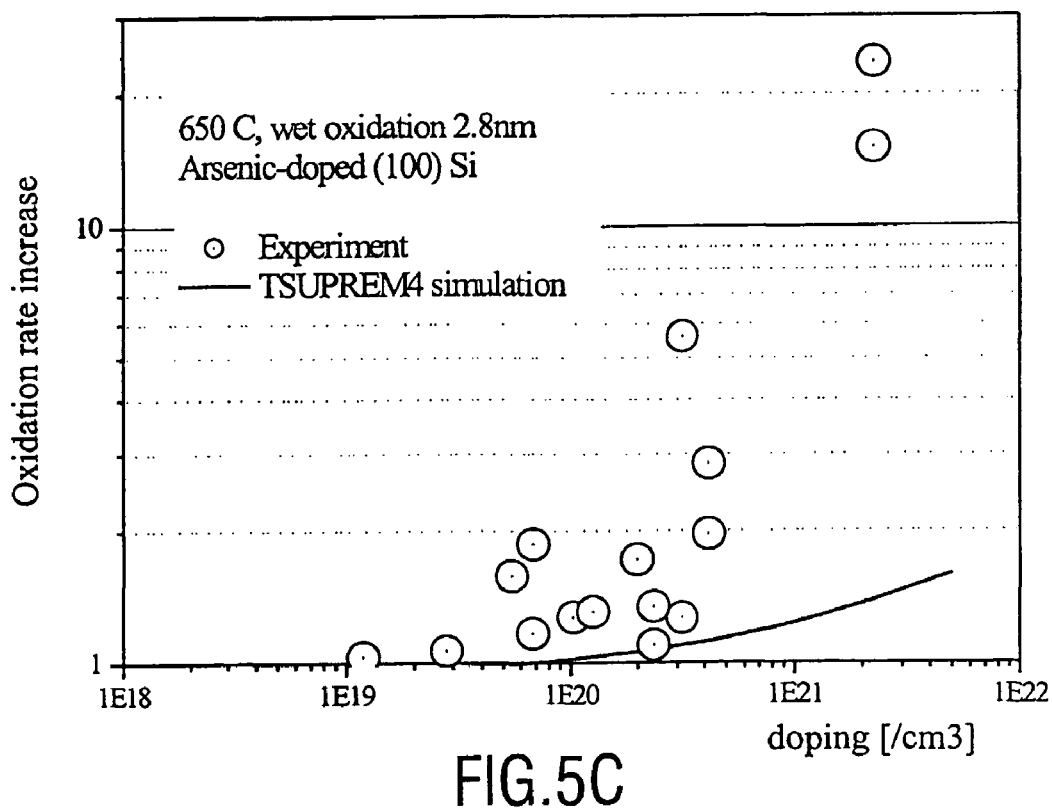

FIG. 5C shows the oxidation rate increase for As-doped Si in function of dopant concentration, for a 2.8 nm thick oxide obtained by wet oxidation at 650° C. Expected oxidation rate increase is compared to experimentally obtained oxidation rate increase. In the different drawings, the same reference figures refer to the same or analogous elements.

The present invention will be described with respect to particular embodiments and with reference to certain drawings but the invention is not limited thereto but only by the claims. The drawings described are only schematic and are non-limiting.

As an example, it will be explained how a 2-T flash EEPROM cell can be manufactured according to the present invention.

According to an embodiment of the present invention, as shown in FIG. 3A, first a conventional stacked gate forming the memory gate stack 12 is formed. This may e.g. be done by growing, on a silicon substrate 18, a tunnel barrier, which is a thin tunnel oxide layer 22 of for example 7 nm thick. On top of this tunnel oxide layer, a first polysilicon layer 24 may be deposited. This layer 24 may for example be 200 nm thick. Thereafter, the first polysilicon layer 24 is highly doped, preferably with n-type dopants 26, such as arsenic (As) or phosphorus (P), leading to a doped first polysilicon layer 28. With highly doped is meant a dopant concentration of at least $6e19/cm^3$, preferably $3e20/cm^3$ or more, still more preferred $1e21/cm^3$ or more. This doped first polysilicon layer 28 will later form a floating gate. On top of the doped first polysilicon layer 28, an interlayer dielectric 30 may be deposited, as shown in FIG. 3B. Such an interlayer dielectric 30 is also called an ONO layer. A, for example, 200 nm thick second polysilicon layer 32 may be deposited on top of the interlayer dielectric 30, and again this layer 32 is highly doped, preferably with n-type dopants 34, such as As or P, leading to a doped second polysilicon layer 36. With highly doped is meant a dopant concentration of at least $6e19/cm^3$, preferably $3e20/cm^3$ or more, still more preferred $1e21/cm^3$ or more. This doped second polysilicon layer 36 will later form a control gate. An optional isolating layer (e.g. nitride or oxide) may be provided on top (not shown in the drawings).

It is to be appreciated that the thickness of the interlayer dielectric 30 in the figures is shown to be relatively the same as the other layers 28, 36 for ease of understanding; however, the ONO layer is actually very thin relative to the first polysilicon layer 24/28 and the second polysilicon layer 32/36.

A resist is lithographically patterned over portions of doped second polysilicon layer 36. Then the doped second polysilicon layer 36 is etched away at portions not covered by the resist. Also the dielectric interlayer 30 is substantially etched away using conventional techniques. The doped first polysilicon layer 28 is substantially etched away using conventional etching techniques, an the tunnel oxide layer 22 is substantially etched away. That way, the stack is patterned, and a stacked gate 38 is formed, as shown in FIG. 3C. Preferably, the device is cleaned, so as to leave bare the surface of the silicon substrate 18 where no stacked gate 38 is present.

After formation of this stacked gate 38, its sidewalls have to be isolated and a gate oxide 20 (see FIG. 2) at the bottom next to it has to be grown. According to the present invention, this is all done in one go, more specifically by a low-temperature oxidation step. With a low-temperature oxidation step is meant an oxidation carried out at a temperature of 700° C. or below, preferably between 500° C. and 700° C., and more preferred between 500° C. and 650° C. The oxidation step preferably is a wet oxidation, and the result is shown in FIG. 3D.

By having chosen a high doping level in both the first polysilicon layer 28 and the second polysilicon layer 36, coupled to a low temperature wet oxidation, the thickness of the oxide 40 on the side walls of the highly doped stacked gate 38 can be tuned in a range of gate thickness to almost twenty times the thickness of the oxide grown on the undoped silicon substrate 18. After this step, both the gate oxide for the access gate transistor 14 as well as the isolation 16 between the memory gate stack 12 and the access gate transistor 14 have been created.

The spacer oxide 16 is thus grown at the same time as the thermal oxidation of the gate oxide 20 of the access transistor 14. As it is known from the prior art, the oxidation rate is dependent on the dopant concentration. For example, the oxidation rate is increased for highly doped As and P doped silicon. Since the oxidation speed depends on the doping level, the oxide layer grows faster on the comparatively strongly doped region of silicon (the stacked gate 38) than on the comparatively weakly doped surrounding silicon zone (the silicon substrate 18) during the oxidation process.

But according to an aspect of the present invention, the oxidation rate is furthermore, unexpectedly, strongly enhanced by using a low temperature oxidation. Because the control gate 36 and floating gate 28 are highly doped, a thick oxide 40 is grown there under low temperature oxidation. This oxide has a much better quality than the conventional TEOS spacer does. With low temperature oxidation is meant an oxidation carried out at temperatures below 700° C., preferably between 500° C. and 700° C. At 700° C., the increase in oxidation rate is a factor 10, and at 650° C., the increase in oxidation rate may even amount to a factor 20.

For example if a P doping 26, 34 in the strongly doped regions 28, 36 of the above 2-T flash EEPROM cell 10 is approximately $3 \times 10^{20}$ at/cm$^2$, an additional silicon oxide 40 with a thickness of approximately 30 nm will grow at the sidewalls of the highly doped stacked gate 38 in the case of thermal oxidation at 700° C. for 15 min in $O_2$, whereas no more than 3 nm silicon oxide 42 is formed on the undoped silicon substrate 18.

Figure 1:
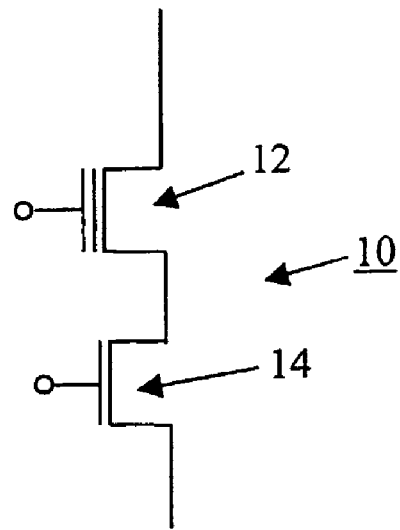
FIG. 1 is a schematic representation of a 2-T flash EEPROM cell.
Figure 2:
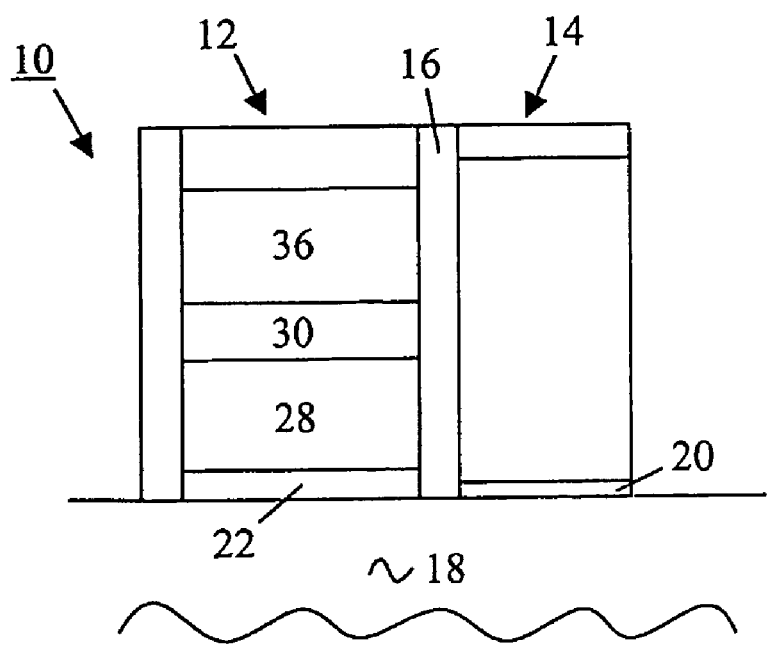
FIG. 2 is a schematic vertical cross-section through a compact 2-T flash EEPROM cell.

For further manufacturing of the 2-T flash EEPROM cell, standard processing can be used, until a device as schematically shown in cross-section in FIG. 2 is obtained.

An advantage of the present invention is that the gate oxide 20 of the access transistor 14 is improved, and that the spacer oxide 16 is much thicker than the ones obtained in prior art methods, which results in a better isolation.

The devices obtained may be used in embedded non-volatile memories.

It should be appreciated that although specific layering materials, layering thicknesses, dopant concentrations and process steps are identified in the above preferred embodiment, any materials, thicknesses, dopant concentrations and processes suitable for carrying out the present invention may be employed and fall within the scope of the claims.

The present invention is described in terms of providing a single cell using particular surface treatments. However, one of ordinary skill in the art will readily recognize that this method and system will operate effectively for other methods including other steps and which provide e.g. multiple cells in a single process. Moreover, the method and system will function effectively for other treatments or systems having a large enough differential oxidation rate between two differently doped semiconductor regions. The technique can be extended to other similar processes where there is need to form high quality oxide layers of different thickness in one processing step.

Figure 4:
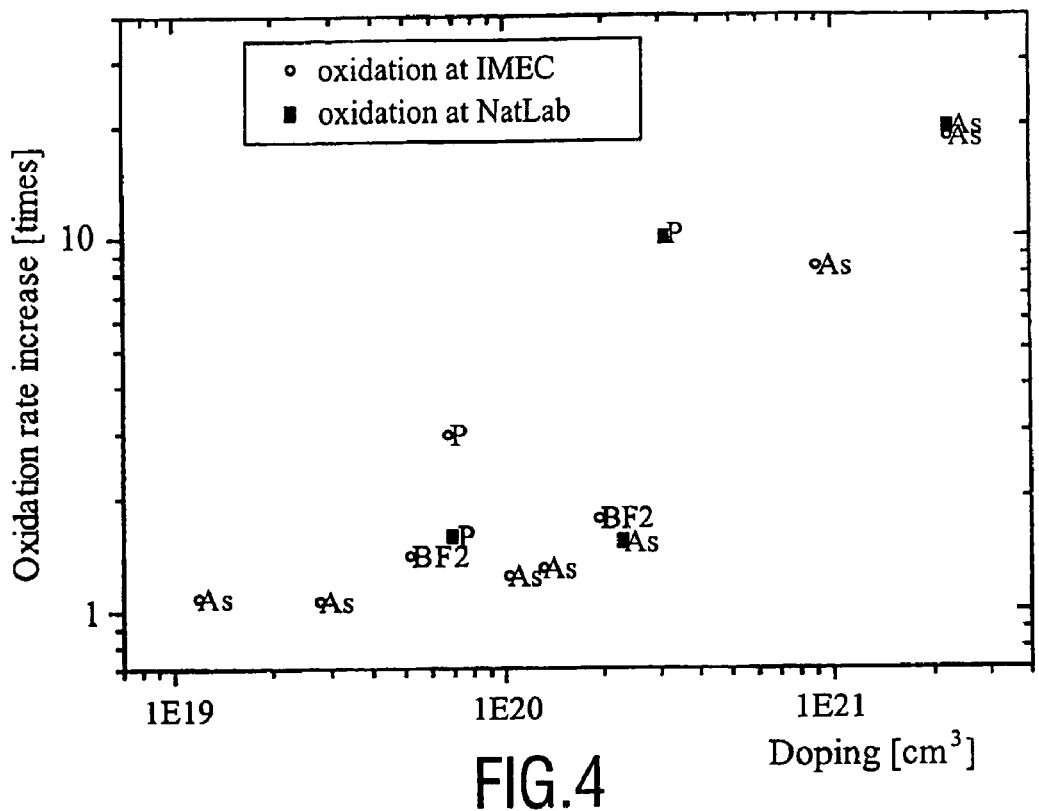
FIG. 4 is a graph showing the oxidation rate dependence on the silicon surface dopant concentration for different implants, at 700° C.

FIG. 4 shows the oxidation rate dependence on the dopant concentration at the Silicon surface for P (Phosphorus), As (Arsenic), B (Boron) and $BF_2$ implants at 700° C. The graph is a summary of data for experiments run at different times and in different clean rooms: data indicated with a black square are obtained at the Philips NatLab FABWAG clean rooms, while data indicated with a white circle are obtained at the IMEC P-LINE. The oxidation of the undoped Silicon was measured to be 10 nm for oxidation at 700° C. It can be seen that, for an As implant, doping levels of $1.186e19$ $cm^{-3}$ do not increase the oxidation rate at 700° C. For As doping levels of $1.029e20$ $cm^{-3}$, there is a slight increase in oxidation rate at 700° C., but for doping levels of $9.089e20$ $cm^{-3}$ the oxidation rate is increased with a factor 8. For higher As doping levels, the oxidation rate is even increased with a higher factor.

The increase in oxidation rate with doping levels is especially important for n-type impurities (such as e.g. P and As).

FIG. 5A shows the expected oxidation rate increase for As-doped Si in function of dopant concentration, for a 10 nm thick oxide obtained by wet oxidation at 650° C. and 700° C. In order to evaluate the expected oxidation rate increase results, an industry-standard semiconductor process simulation tool from AVANT!, TSUPREM4, is used. Although only results for As-doped Si are given in the present patent application, the same conclusions can be drawn for P-doping. For As-doped Si oxides with a thickness of 10 nm, obtained by wet oxidation, it can be seen from FIG. 5A that the oxidation rate is expected to increase with the doping level. In this thickness range, oxidation is expected to decrease with decrease in temperature.

However, according to the present invention, and as shown in FIG. 5B and FIG. 5C, the combination of a high doping level and a low oxidation temperature results in a higher oxidation rate increase than expected.

FIG. 5B compares the expected oxidation rate increase, at an oxidation temperature of 700° C., with experimentally obtained values. It can be seen that for doping levels of 1 e21 $cm^{-3}$ or higher, the oxidation rate increase is a factor 4 or more higher than expected.

For lower temperatures, for example 650° C. as shown in FIG. 5C, a still larger discrepancy between the experimentally obtained oxidation rate increase and the expected values is obtained.

For temperatures below 700° C. and doping levels above 1e21 $cm^{-3}$, an increase of oxidation rate to values of 10 or more is obtained, which makes this method useful to make non-volatile memory elements by forming oxide layer of different thickness in one processing step. In such memory elements, it is typically desired to have a thin gate dielectric of a thickness of 3 nm or less, and a gate oxide between the access transistor and the control gate of a thickness of 30 nm or more. If those oxides are to be made in one go, there must be an oxidation rate difference of at least 10.

The invention claimed is:

1. A method for forming a high quality oxide layer of different thickness over a first and a second semiconductor region in one processing step, comprising the steps of:
   producing a doped gate stack that includes the first semiconductor region by growing a tunnel oxide on the semiconductor,
   depositing floating gate polysilicon on the tunnel oxide,
   doping the floating gate polysilicon, thus forming doped floating gate polysilicon,
   depositing an interlayer dielectric on the doped floating gate polysilicon, and
   depositing control gate polysilicon on the interlayer dielectric;
   doping the first semiconductor region, including the control gate polysilicon, with a dopant concentration that is higher than a dopant concentration of the second semiconductor region, and
   oxidising both the first and the second semiconductor regions during the same processing step at a temperature between 500° C. and 650° C. to form the oxide layer predominantly from portions of the first and second semiconductor regions that are oxidized, the oxide layer having a thickness over the first semiconductor region that is at least two times thicker than a thickness of the oxide layer over the second semiconductor region.

2. A method according to claim 1, wherein the dopant concentration of the first semiconductor region is at least a factor 10 higher than the dopant concentration of the second semiconductor region, and wherein the thickness of the oxide layer over the first semiconductor region is at least 10 times thicker than the thickness of the oxide region over the second semiconductor region.

3. A method according to claim 2, wherein the dopant concentration of the first semiconductor region is at least $1 \times 10^{21}$ $cm^{-3}$.

4. A method according to claim 1, wherein the doping step of the first semiconductor region is carried out with n-type dopants.

5. A method according to claim 1, wherein the doping step of the first semiconductor region is carried out with p-type dopants.

6. A method according to claim 1, further comprising a step of patterning the doped gate stack.

7. A method according to claim 1, wherein the oxidising step is a wet oxidation process.

8. A method according to claim 1, wherein the oxidizing step is accomplished without depositing an oxide layer on the semiconductor regions.

9. A method according to claim 1, wherein the second semiconductor region is a substrate and part of the oxide layer that is formed over the substrate forms a gate oxide of an access transistor.

10. The method of claim 1, wherein the step of oxidising both the first and the second semiconductor regions includes using the dopants at their respective concentrations in the first and second semiconductor regions to control the relative thicknesses of the oxide layer over the first and second semiconductor regions to set the thickness of the oxide layer over the first semiconductor region to at least 10 times thicker than the thickness of the oxide region over the second semiconductor region.

11. The method of claim 1, further including the step of forming a memory gate stack adjacent to the oxide layer of the second semiconductor region, wherein the oxide layer acts as an isolating spacer between the memory gate stack and the doped gate stack.

12. The method of claim 1, wherein the step of oxidizing is implemented at a temperature less than 600° C.

* * * * *